(12) United States Patent
Buckley, Jr.

(10) Patent No.: US 7,165,231 B2
(45) Date of Patent: Jan. 16, 2007

(54) METHOD AND SYSTEM FOR INCREMENTAL BEHAVIORAL VALIDATION OF DIGITAL DESIGN EXPRESSED IN HARDWARE DESCRIPTION LANGUAGE

(75) Inventor: Delmas R. Buckley, Jr., Livermore, CA (US)

(73) Assignee: Yardstick Research, LLC, Livermore, CA (US)

( * ) Notice: Subject to any disclaimer, the term of this patent is extended or adjusted under 35 U.S.C. 154(b) by 275 days.

(21) Appl. No.: 10/904,413

(22) Filed: Nov. 9, 2004

(65) Prior Publication Data

US 2005/0071791 A1    Mar. 31, 2005

Related U.S. Application Data

(63) Continuation-in-part of application No. 10/308,294, filed on Dec. 2, 2002, now abandoned, which is a continuation of application No. 09/740,632, filed on Dec. 18, 2000, now Pat. No. 6,490,711.

(51) Int. Cl.
*G06F 17/50* (2006.01)
(52) U.S. Cl. .................. 716/5; 716/11; 703/16
(58) Field of Classification Search ............ 716/5, 716/11; 703/16
See application file for complete search history.

(56) References Cited

U.S. PATENT DOCUMENTS

| | | | |
|---|---|---|---|
| 5,701,443 A * | 12/1997 | Oguma et al. ............... 703/15 |
| 5,809,283 A * | 9/1998 | Vaidyanathan et al. ....... 703/16 |
| 5,910,897 A * | 6/1999 | Dangelo et al. ............. 716/19 |
| 5,933,633 A | 8/1999 | Good et al. |
| 5,987,442 A * | 11/1999 | Lewis et al. ................. 706/10 |
| 6,141,630 A | 10/2000 | McNamara et al. |
| 6,175,946 B1 | 1/2001 | Ly et al. |
| 6,209,120 B1 | 3/2001 | Kurshan et al. |
| 6,216,252 B1 | 4/2001 | Dangelo et al. |
| 6,292,765 B1 | 9/2001 | Ho et al. |
| 6,321,363 B1 | 11/2001 | Huang et al. |
| 6,366,874 B1 | 4/2002 | Lee et al. |

(Continued)

OTHER PUBLICATIONS

Pietro et al., "Generation of Execution Sequences for Modular Time Critical Systems", IEEE Transactions on Software Engineering, vol. 26, No. 2, Feb. 2000, pp. 128-149.*

(Continued)

*Primary Examiner*—Phallaka Kik
(74) *Attorney, Agent, or Firm*—Robert Buckley (57) ABSTRACT

A method for an incremental behavioral validation of a digital design expressed in a hardware description language includes: receiving a design expressed in HDL code; providing a user interface permitting a designer to insert special comments into the received HDL code; using the special comments to identify testable parts of the design; creating a demonstration sequence for a testable part; performing a behavioral simulation of the testable part and applying the demonstration sequence at inputs of that part to drive the simulation; displaying the results of the simulation via the user interface by observing outputs of the simulated testable part, permitting the designer to determine whether the testable part implements the requirements of an informal specification; modifying the HDL design to correct designer identified failures; and selecting a next testable part and continuing until all testable parts correctly implement the designer's understanding of the informal specification.

20 Claims, 6 Drawing Sheets

U.S. PATENT DOCUMENTS

| | | | |
|---|---|---|---|
| 6,446,243 | B1 | 9/2002 | Huang et al. |
| 6,490,711 | B1 | 12/2002 | Buckley |
| 6,594,804 | B1* | 7/2003 | Hojati ............................ 716/5 |
| 6,698,002 | B1* | 2/2004 | Chang et al. ................... 716/4 |
| 7,089,517 | B1* | 8/2006 | Yamoto et al. ................. 716/5 |
| 2001/0025369 | A1* | 9/2001 | Chang et al. ................. 716/18 |
| 2002/0032889 | A1 | 3/2002 | Ghosh |
| 2002/0059054 | A1* | 5/2002 | Bade et al. .................... 703/20 |
| 2002/0078424 | A1* | 6/2002 | Buckley, Jr. ................... 716/5 |
| 2003/0135832 | A1* | 7/2003 | Buckley, Jr. ................... 716/5 |
| 2005/0010880 | A1* | 1/2005 | Schubert et al. ............... 716/4 |
| 2005/0022086 | A1* | 1/2005 | Kotz et al. ................... 714/742 |

OTHER PUBLICATIONS

Y.-C. Hsu, et al., "Advanced Techniques for RTL Debugging," Proc. Des. Auto. Conf., 2003, pp. 362-367.

C.-N.J. Liu, et al., "An Automatic Controller Extractor for HDL Descriptions at the RTL," IEEE Des. Test Comp., Jul.-Sep. 2000, pp. 72-77.

L. Zhang, et al., "Automatic Design Validation Framework for HDL Descriptions via RTL ATPG," Proc. 12th Asian Test Symp., 2003.

I. Ghosh, et al., "On Automatic Generation of RTL Validation Test Benches Using Circuit Testing Techniques," GLSVLSI'03, Apr. 28-29, 2003, pp. 289-294.

R.E. Bryant, "A Methodology for Hardware Verification Based on Logic Simulation," Jour. ACM, vol. 38, No. 3, Apr. 1991, pp. 299-328.

T.-H. Wang, et al., "Practical FSM Analysis for Verilog," Int'l Verilog HDL Conf. and VHDL Int'l Users Forum, Mar. 1998, pp. 52-58.

K.-T. Cheng, et al., "Automatic Generation of Functional Vectors Using the Extended Finite State Machine Model," ACM Trans. Des. Auto. Elec. Sys., vol. 1, No. 1, Jan. 1996, pp. 57-79.

* cited by examiner

METHOD AND SYSTEM FOR INCREMENTAL BEHAVIORAL VALIDATION OF DIGITAL DESIGN EXPRESSED IN HARDWARE DESCRIPTION LANGUAGE

RELATED APPLICATIONS

This patent application is a continuation-in-part of formerly U.S. patent application Ser. No. 10/308,294, filed Dec. 2, 2002, now abandoned, which is a continuation of U.S. patent application, Ser. No. 09/740,632, filed Dec. 18, 2000, now U.S. Pat. No. 6,490,711. The full disclosures of both prior patent applications are incorporated herein by reference. Portions of the present patent application claim the benefit, under 35USC 120, of the filing date of U.S. patent application Ser. No. 09/740,632.

FIELD OF THE INVENTION

The invention relates to digital design verification, and more specifically to a method and system for an incremental behavioral validation of a digital design expressed in a hardware description language (class 716, subclasses 4 and 5).

BACKGROUND OF THE INVENTION

Figure 1:
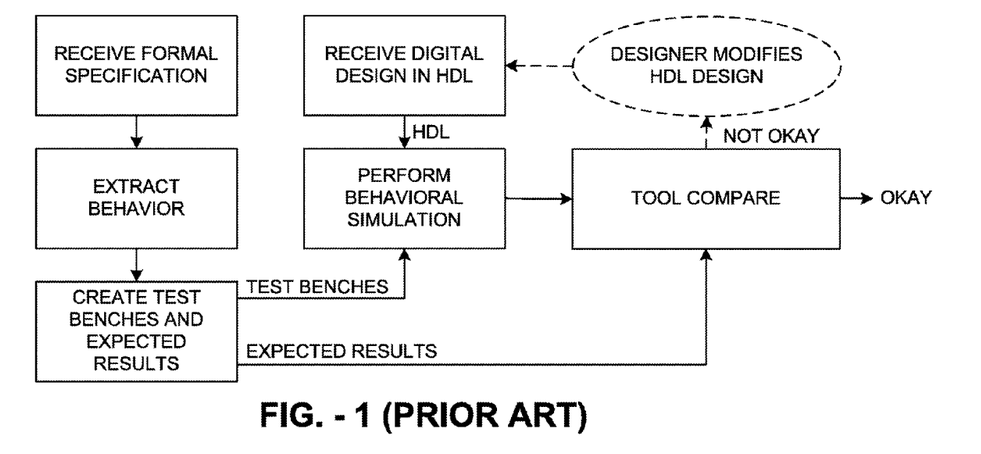
FIG. 1 is a flow chart illustrating a typical prior art EDA tool suite method for the behavioral verification of a digital design expressed in a hardware description language.

FIG. 1 is a flow chart illustrating a typical prior art EDA tool suite for the behavioral verification of a digital design expressed in a hardware description language ("HDL"). The verification of the design presupposes the existence of a formal design specification used to derive test benches that drive a behavioral simulation of the HDL-expressed digital design. The tool suite computes expected responses and compares these with the outcome of the simulation. When the comparison fails, the designer revises the HDL code that defines the digital design to bring the simulation result into compliance with the formal specification.

The elements of the tool suite cooperate to perform the verification function, and include multiple features not directly related to a behavioral design verification function. The unused features place the price of the tool suite out of reach for many low level digital design projects and small firms.

Most low cost design projects do not begin with a formal design specification. Instead, the designer receives and creates multiple informal specification documents including interface specifications, block diagrams, partial schematic diagrams, waveform diagrams, pseudo code listings, copies of product specifications, and hand written notes, among other items. In the course of the project some or all of these specification documents are subject to revision and even replacement or elimination.

Throughout a project, a design specification, to the extent one exists at all, is informal and exits in the mind of the designer. It is the designer's understanding and interpretation of the myriad documents that serve as a design specification. Because of the pressures of time-to-market and a lack of staff, money, and EDA tool resources, the small project cannot afford the luxury of a formal design specification. Despite these drawbacks, a design is completed and reliable behavioral design validation is rushed or sometimes simply not attempted.

What is needed is a low-cost EDA tool (costing approximately what a word processor costs) that can be run on a standard desktop computer having sufficient memory, a display, a keyboard, and a pointing device.

The low-cost tool should include only the elements necessary for editing a design expressed in a hardware description language, for performing an acceptable behavioral simulation, and for debugging a digital design of moderate size (block) expressed in a hardware description language such as Verilog or VHDL.

The tool should permit every design signal to be selectively controlled and observed.

The tool should provide an easy-to-use interface permitting use of the pointing device to select individual signals and busses for control and observation.

The tool user interface should permit display of state transition graphs highlighted to show regions validated and current state and next edge.

The tool should permit single stepping through validation demonstration sequences.

The tool should be able to display selected waveforms.

The tool should be able to accept user special comments for partitioning the design into testable parts.

The tool should derive demonstration sequences for finite state machine parts and should use automatic selections from a library of standardized demonstration sequence templates for all other parts.

The tool should permit the standardized demonstration sequence templates to be automatically adapted for variations in bus width and the like.

The tool should permit behavioral simulation using demonstration sequences operating at a low level for initial validation and debugging with more complex sequences available for higher assurance validation.

SUMMARY OF THE INVENTION

These needs and others that will become apparent are met by the present invention which defines a method and system for an incremental behavioral validation of a digital design expressed in a hardware description language. The system defines an EDA tool capable of operating on a standard desktop computer having sufficient internal memory.

Behavioral validation of a digital circuit expressed in a hardware description language such as Verilog or VHDL uses designer entered special comments for classifying testable parts of a circuit of moderate size (block). In a specific embodiment, a testable part is a design module having defined inputs, outputs, and functions. Demonstration sequences for each testable part are derived from the specially commented HDL design. The testable part inputs are controllable and the outputs are observable. In another specific embodiment, all signals are both controllable and observable via a user interface display controlled by the desktop computer.

Each testable part of the design is behaviorally simulated and the designer decides whether or not the simulated design implements his understanding of informal design specification documents. When a testable part does not implement the designer's intent, he uses the tool to modify the HDL code, creates a new demonstration sequence, and repeats the simulation and comparison cycle.

Other embodiments of the invention include a computer program product recorded on a computer readable medium for instructing the desktop computer to provide the low-cost EDA tool and its limited features.

DESCRIPTION OF THE PREFERRED EMBODIMENTS

Introduction

The following terms are defined for purposes of this description.

| Term | Definition |
| --- | --- |
| Behavioral simulation | Simulation that demonstrates a design's behavior, also referred to as functional simulation |
| Controllable signal | Ability to apply a demonstration sequence to any signal or bus. Every named signal is controllable |
| Debug | To discover and eliminate design errors in a digital design |
| Demonstration sequence | A sequence of vectors used to drive a simulation of a testable part from inputs of, and to compare with results at outputs of the testable part |
| Design module | A standard HDL entity having a defined port (inputs, outputs), and architecture (function) |
| EDA tool | A computer programmed to assist a designer in creating and validating a digital design; also referred to in the literature as a CAD (computer-aided design) tool. |
| Expected response | Predetermined response at outputs of a simulated testable part |
| Formal specification | A document that tells the designer what to design |
| HDL | Hardware description language such as Verilog and VHDL |
| Included edge | A state transition graph directed edge originating at a reachable state and ending at a reachable state - may be the same state or an initial state |
| Informal specification | One or more related documents that guide a designer in deciding what to design |
| Observable signal | Ability to display the behavior of any signal or bus. Every named signal is observable |
| Pointing device | Computer mouse and the like |
| Reachable state | A state transition graph state having a path from an initial state |
| Simulation | Using a computer to interpret HDL and behave as though it is a digital circuit |
| Special comments | Comment lines inserted into the HDL by the designer to identify testable parts |
| Sufficient memory | Usually at least 500 MB |
| Test bench | A sequence of vectors used to drive a simulation or a portion of a design when applied to primary inputs and observed at primary outputs of the design |
| Testable part | A portion of a design identified by special comments, performing specific functions and having controllable inputs and observable outputs |
| Validation | Comparison of the behavior of a simulated testable part with a designer's understanding of the requirements of an informal specification |
| Verification | EDA tool comparison of the behavior of a simulated design with the requirements of a formal specification |

The motivation for this work is that once an HDL design is complete, a designer needs to determine if what he has designed correctly implements his intentions, i.e., his understanding of what it was he was asked to design.

Simulation of the design at a behavioral level is usually adequate to answer this need.

Simulators are available that can compile his HDL and behave as though the simulation is the designed circuit.

In order to make use of the powerful tool of behavioral simulation, the designer must in general provide a collection of input vector sequences commonly referred to as test benches. These vectors are typically applied at input connections (i.e., IO pins) of the simulated circuit in an attempt to exercise the functions of a part of the circuit. Results are typically viewed at the circuit's output connections.

This is the point at which this standard approach hits a major snag. Test benches are difficult and time consuming to create and debug to insure they are correct. Also, test benches that attempt to exercise specific internal modules by controlling the circuit from its input connections and observing results from output connections are unnecessarily long and complex.

There are approaches described in the literature that analyze HDL code and find parts of a design that can be tested by controlling primary inputs and propagating effects for observation at primary outputs: see for example C.-N. J. Liu et al., "An Automatic Controller Extractor for HDL Descriptions at the RTL," IEEE Des./Test Comp., July-September 2000, pp 72–77; L. Zhang et al., "Automatic Design Validation Framework for HDL Descriptions via RTL ATPG," Proc. 12$^{th}$ Asian Test Symp., 2003; and I. Gosh et al., "On Automatic Generation of RTL Validation Test Benches Using Circuit Testing Techniques," GLSVLSI'03, Apr. 28–29, 2003, pp 289–294; see also U.S. Pat. No. 6,175,946, U.S. Pat. No. 6,292,765, and U.S. Patent Appl. Pub. No. 2002/0032889. The full disclosures of the patents and the published patent application are incorporated herein by reference.

The present invention takes a different approach altogether. It permits the designer to classify testable parts of an HDL design using special comments that he inserts into the HDL code (see U.S. patent application Ser. No. 6,490,711). Typically a testable part is an HDL design module, for example, a Verilog module or a VHDL entity/architecture having defined lists of input and output signals.

Rather than verifying part of the design by controlling primary inputs and observing results at primary outputs, a testable part is validated by directly controlling signals that are inputs to the testable part and observing signals that are outputs of the testable part.

This is possible because the simulation is carried out as programmed instructions running on a digital computer. There are no overriding reasons why simulated signals cannot be selectively controlled and observed. This is not work being carried out on a physical chip where it would be difficult or impossible to access signals unless they are available at IO pins. Also, the simulation is behavioral and is often occurring in a single-step mode for smaller, testable parts of a design so that there is no need for high simulation speed. The additional time required per simulation clock period to control and to observe internal signals is not consequential under these assumptions.

Rather than the usual test benches, the sequences that drive the behavioral simulation of a testable part are referred to as demonstration sequences. A demonstration sequence causes the testable part of a design to demonstrate some or all of its behavior for observation by the designer and is applied at inputs of the testable part.

The designer can cause the demonstration of behavior to proceed at a low level to permit simple validation, or alternatively, he can cause the demonstration to validate more complex behavior of a testable part once he is satisfied that low level behavior implements his design intention.

Comparison with intended behavior is, in general, made by the designer observing highlighted state transition graphs, waveforms, individual signal levels, and bus content and comparing these, as appropriate to the design part being simulated, with the designer's understanding of the informal design specification documents.

Such an approach is not strong verification because the designer may be inattentive or forgetful or mistaken. But it is design validation nonetheless, and is intuitive for use by most designers who tend to think in structural and behavioral terms. The designer will find this new tool helpful in gaining confidence that a design block is ready for release into a larger project.

The ability to begin validation at a low level, such as insuring that some basic path through a displayed state transition graph can be properly traversed, or that simple data patterns can be moved successfully through a data path is helpful and intuitive. This is not a tool that will keep a novice designer out of trouble—subtle mistakes will still be made. It is, however, a tool that will permit a designer to work in a natural manner, making him more productive during the early design debugging and validation stages.

In the description that follows, the words "designer" and "user" are used interchangeably. In similar fashion the word "tool" and the phrase "EDA tool" are sometimes used when the word "method" might seem more appropriate. A person skilled in the art will appreciate that a user of the present invention is most often the circuit designer, and that the EDA tool and a method embodied in such a tool might be referred to interchangeably without confusion.

Details of Operation

Figure 2:
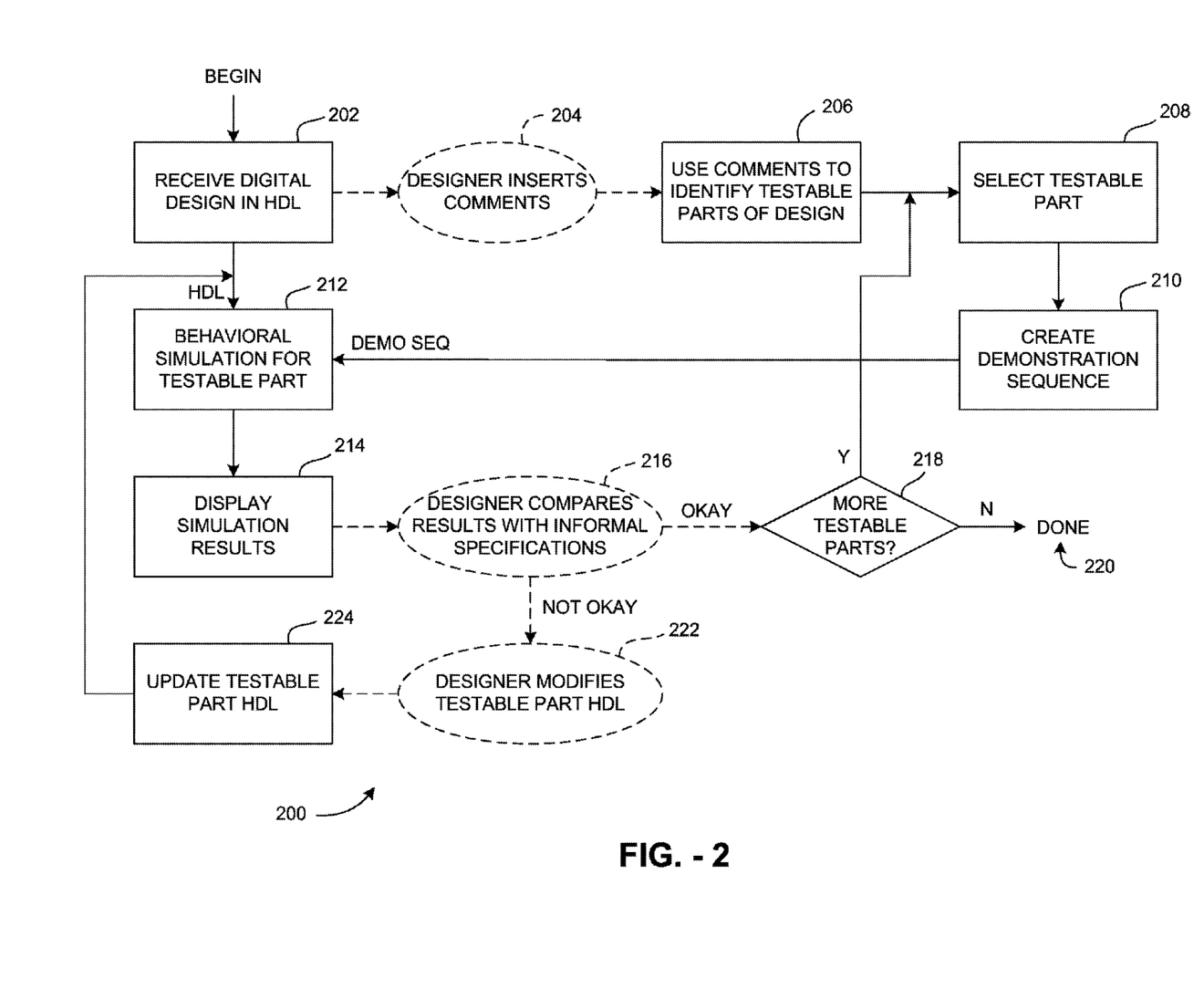
FIG. 2 is a flow chart illustrating an EDA tool method for the behavioral validation of a digital design expressed in a hardware description language according to one aspect of the present invention.

FIG. 2 is a flow chart illustrating an EDA tool method for an incremental behavioral validation of a digital design expressed in a hardware description language according to one aspect of the present invention. The method steps are designated generally by the reference numeral 200 and include a step 202 for receiving a digital design expressed in an HDL, a step 204 for permitting the designer to insert special comments into the received HDL code, a step 206 for using the specially commented HDL to identify testable parts of the design, a step 208 for selecting a testable part, a step 210 for creating a demonstration sequence for the selected testable part, a step 212 for performing a behavioral simulation of a testable part, a step 214 for displaying simulation results, a step 216 for permitting the designer to compare simulation results with his understanding of the requirements of an informal specification, a step 218 for determining whether there are more testable parts requiring validation, a step 220 for stopping when no testable parts remain to be validated, a step 222 for permitting the designer to revise his HDL code for a testable part when he concludes the existing code does not implement the design intent, and a step 224 for updating the failed/revised HDL code.

The method 200 is typically embodied in a computer program that runs on a digital computer. The computer, its operating system, peripherals, and a tool application program cooperate to provide the designer with an EDA tool that he can use to incrementally validate and debug his digital design expressed in an HDL code. The tool typically includes a user interface that allows a designer to use a keyboard, mouse, and display to enter and modify the HDL code and to control and monitor the design validation process. Small, testable parts of the design are selected (step 208), demonstration sequences for these parts are created (step 210) and are used to drive a behavioral simulation (step 212) of the selected testable part. The results of the simulation are displayed (step 214) and the user compares the results with his understanding of the assorted informal design specification documents (step 216). When he is satisfied that a testable part correctly implements his understanding of the informal specification ("OKAY"), he selects another testable part and continues. When the user concludes that a testable part does not correctly implement his understanding of the informal specification ("NOT OKAY"), he uses the edit function to modify the HDL code of the testable part (or other parts of the design as he deems necessary) to correct the functionality of the testable part (step 222). An updated demonstration sequence is created and the behavioral simulation of the testable part is repeated until the designer concludes that the functionality of the testable part implements his understanding of the requirements of the informal specification. When several related testable parts have been successfully validated in this manner, the user is able to select combinations of these parts and validate the combination.

In a specific embodiment, the EDA tool method receives a digital design that is expressed in a hardware description language (received HDL code at step 202) such as Verilog and VHDL. A design is sometimes expressed in a combination of several such languages when portions of the design are imported from a source other than the designer (for example, reusable portions of a previous design or portions of the design that are created by a third party). In a specific embodiment, the EDA tool is limited to a single hardware description language.

The designer uses the tool to insert special comments into the received HDL code (step 204). The tool provides a user interface including a keyboard, mouse and display permitting a user (typically the designer) to edit the received HDL code by inserting the special comments. In a specific embodiment of the invention the inserted comments bracket blocks of code defining specific functions the designer wants to validate. These inserted comments are used by the tool to identify testable parts of the design (step 206).

A testable part is a block of code that performs some specific function or functions and typically is a Verilog module or VHDL entity/architecture having defined inputs and outputs. A person having an ordinary level of skill in the art will appreciate that HDL code statements are testable when they define an output in terms of inputs, for example a Verilog continuous assign statement in which the signal on the left-hand side of the equal sign is treated as an observable output and the signal(s) on the right-hand side of the equal sign are treated as controllable inputs. It is important to keep in mind that in a specific embodiment of the invention every signal can be selectively controlled and observed.

Figure 3:
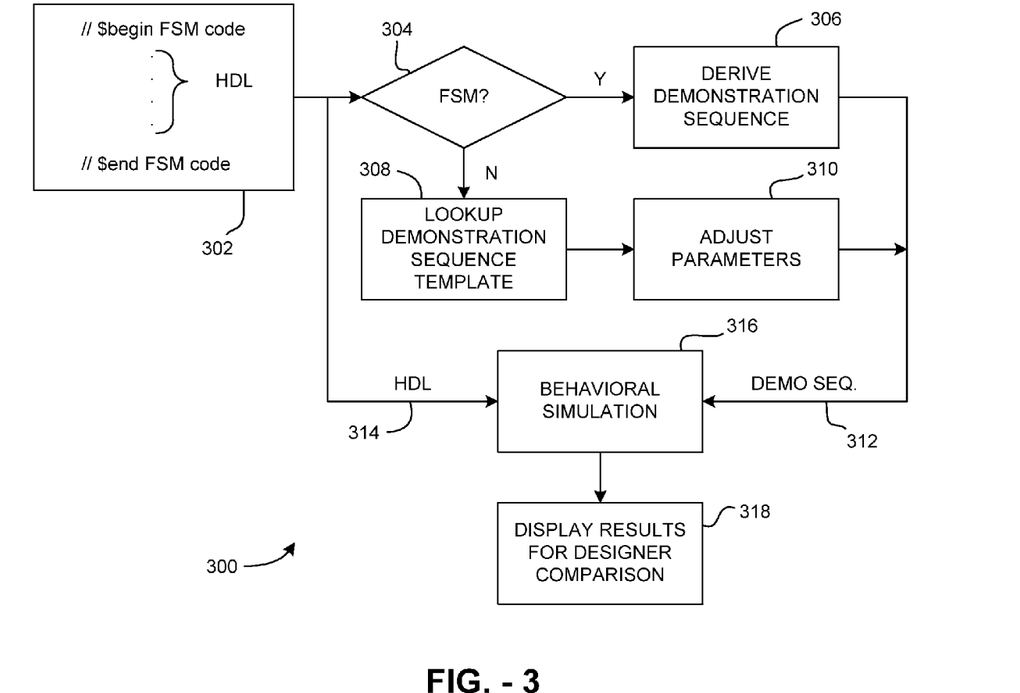
FIG. 3 is a partial flow chart illustrating the use of special comments for identifying testable parts of a digital design and method steps for obtaining a demonstration sequence for a selected testable part of the design.

FIG. 3 is a partial flow chart illustrating the use of special comments for identifying testable parts of a digital design and method steps for obtaining a demonstration sequence for a selected testable part of the design. The method steps are designated generally by the reference numeral 300 and include selected testable part HDL design code 302 including special comments, a step 304 for determining whether the selected HDL code defines a finite state machine ("FSM"), a step 306 for deriving a demonstration sequence for an FSM, a step 308 for lookup of a demonstration sequence template, a step 310 for adjusting template parameters, a resulting demonstration sequence 312, selected testable part HDL code 314, a step 316 for behavioral simulation of the selected testable part, and a step 318 for display of the results of the simulation for designer comparison.

Methods are known for deriving test benches for finite state machines having defined inputs and outputs (see for example U.S. Patent Appl. Pub. No. 2002/0032889 cited above). A demonstration sequence differs from the traditional test bench in that the demonstration sequence directly drives inputs of a testable part and provides expected results for comparison with outputs of the testable part, while a test bench typically drives circuit primary inputs and provides expected results for comparison with circuit primary outputs.

This is not a trivial difference. When a testable part lies deep within a larger circuit a test bench must enable paths to the actual inputs of a testable part in order to control those inputs from circuit primary inputs, and then enable paths from the actual outputs of the testable part to circuit primary outputs so that results can be observed/compared. Thus a test bench typically contains many more primary input vectors to achieve the required path enabling than a demonstration sequence that validates the same testable part.

A demonstration sequence is shorter and simpler because it operates directly on testable part inputs and outputs without the need to reach through the circuit from primary inputs and to primary outputs and all that that entails. Deriving a demonstration sequence for a finite state machine buried deep within a larger circuit is generally a subset of the steps necessary to derive an equivalent test bench for the same finite state machine.

In a specific embodiment of the invention a testable part is identified by bracketing a block of HDL code with a pair of user inserted special comments. In FIG. 3 the HDL code block 302 is bracketed by special comments "// $begin FSM code" and "// $end FSM code". The tool interprets these comments at step 304 as defining a finite state machine, and derives an appropriate demonstration sequence for the finite state machine at step 306. In general, the method for deriving a demonstration sequence for a testable part identified as a finite state machine derives an equivalent of a state transition graph for the machine and creates input sequences that will drive the machine through each reachable node along included graph edges so that all reachable portions of the graph, including outputs, are demonstrated.

Validating testable parts of a design that are identified as non-FSM parts employs a different strategy. Rather than deriving demonstration sequences for the non-FSM testable parts, the demonstration sequences are based upon preprogrammed demonstration sequence templates. These templates contain input and expected output sequences for validating typical design blocks such as adders, ripple-carry adders, carry-look-ahead adders, 2s-complementors, multipliers, counters, shifters, rotators, and bit-wise Boolean logic functions such as AND, OR, NOT, XOR.

Methods for constructing test and validation input vectors for such design block types are known (see for example I. Ghosh et al., "On Automatic Generation of RTL Validation Test Benches Using Circuit Testing Techniques," cited above). The construction of expected outputs is straightforward given known input vectors.

In a specific embodiment of the invention, the tool includes a library of demonstration sequence templates for standard width data buses. The bracketing special comments used to identify these standardized testable part types drive the lookup step 308 in which a specific template is selected from the library. The selected template is then adjusted for actual bus width and the like at step 310. The resulting demonstration sequence 312 is applied to the behavioral simulation step 316 and the results of the simulation are displayed at step 318.

Figure 4:
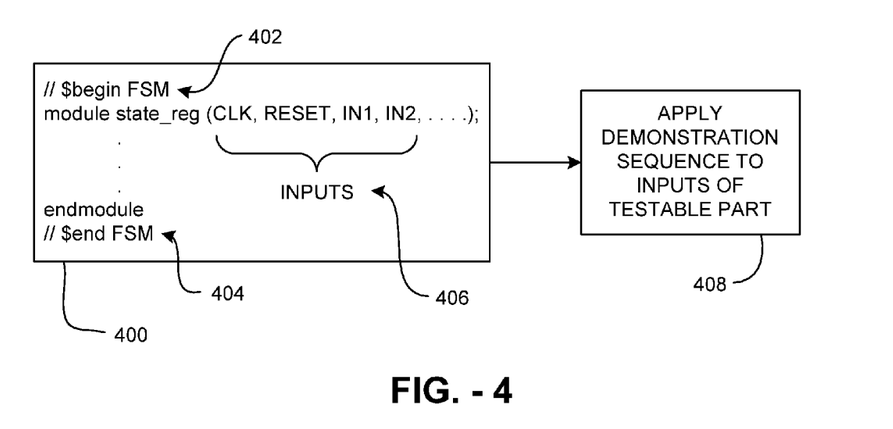
FIG. 4 is a partial flow chart illustrating a demonstration sequence being applied to inputs of a testable part.

FIG. 4 is a partial flow chart illustrating a demonstration sequence being applied to inputs of a testable part. In this example, Verilog HDL code is designated by the reference numeral 400 and includes a special comment 402 identifying the beginning of code identifying a testable part as a finite state machine, a special comment 404 identifying the end of code defining the finite state machine, input ports 406 designating controllable inputs of the finite state machine, and a step 408 for applying a demonstration sequence to inputs of the testable part.

In a specific embodiment of the invention every HDL-named signal is selectively controllable, which means that both the tool and the user can select a signal or a bus for control, overriding other signals that may be attempting to drive the selected signal/bus. The tool makes a selection when a demonstration sequence is to be applied automatically to named input ports of a module or entity/architecture. Alternatively, the user makes a selection when he wants to explore the effect the control of a particular signal/bus has upon testable part behavior.

Figure 5:
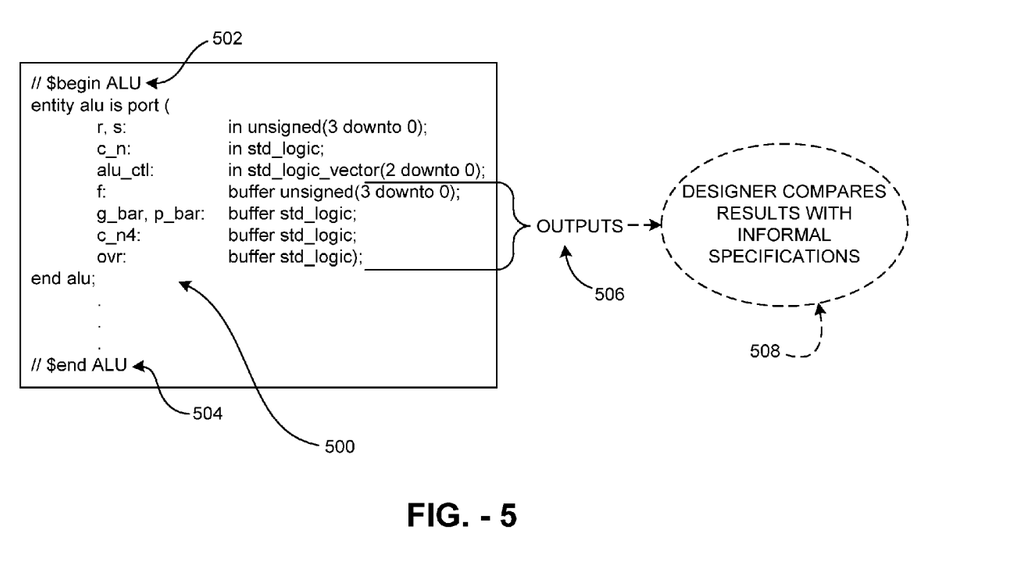
FIG. 5 is a partial flow chart illustrating behavioral simulation results obtained from outputs of a testable part.

FIG. 5 is a partial flow chart illustrating behavioral simulation results obtained from outputs of a testable part. In this example, VHDL code is designated generally by the reference numeral 500 and includes special comments 502 and 504 identifying, respectively, the beginning and end of HDL code defining an arithmetic logic unit ("alu" also "ALU"), observable testable part outputs 506, and a step 508 for permitting the designer to compare displayed results of a behavioral simulation with his understanding of an informal specification.

In another specific embodiment of the invention every HDL-named signal is selectively observable, which means that both the tool and the user can select a signal or a bus for observation. The tool makes a selection when expected results of a demonstration sequence are available at output ports 506 of a testable part, as illustrated in FIG. 5. Alternatively, the user makes a selection when he wants to observe behavior at a signal/bus not automatically selected by the tool.

Figure 6:
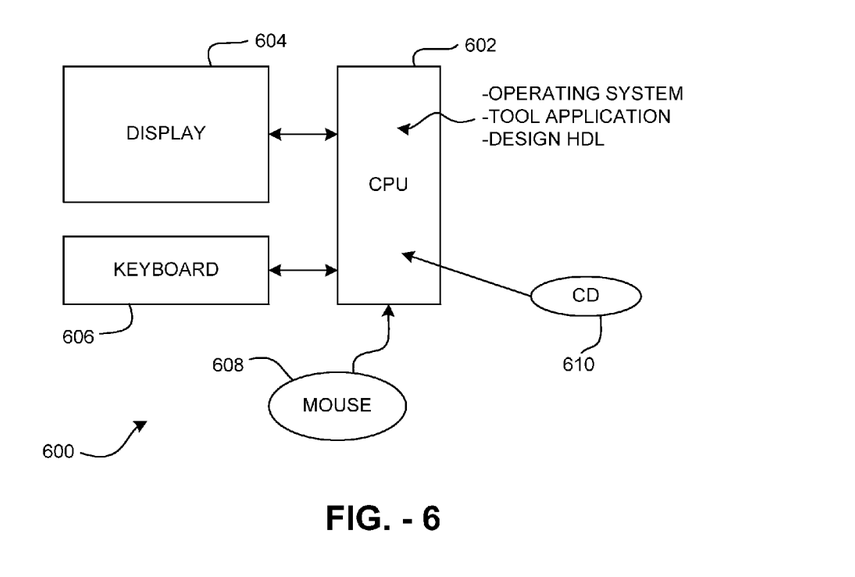
FIG. 6 is a block diagram of a desktop computer system configured as an EDA tool according to another aspect of the present invention.

FIG. 6 is a block diagram of a desktop computer system configured as an EDA tool according to another aspect of the present invention. The tool is designated generally by the reference numeral 600 and includes a desktop computer 602 ("CPU"), a display 604, a keyboard 606, a computer pointing device 608 ("Mouse"), and a computer program product 610 ("CD").

A standard desktop computer or work station is configured as the EDA tool according to another aspect of the present invention by loading the computer program product 610 into the computer. The program product 610 is computer readable and in a specific embodiment provides a tool application that works in conjunction with the computer's operating system, and a user interface to configure the computer system 600 as an EDA tool according to one aspect of the invention. The user interface includes the keyboard 606, the mouse (or other pointing device) 608, and the display 604.

Figure 7:
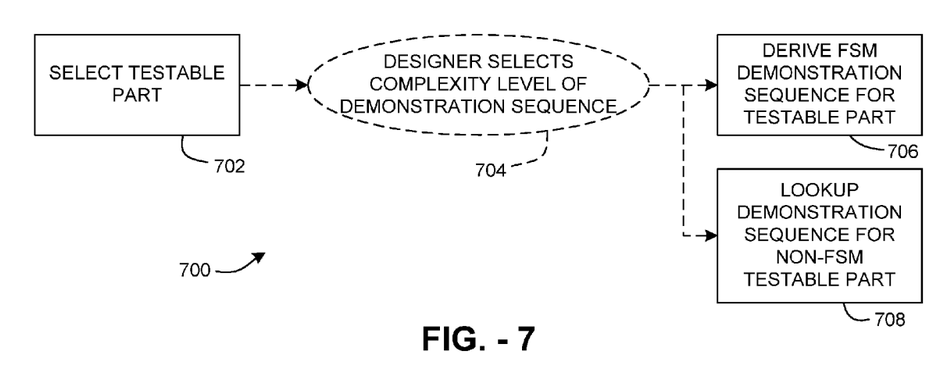
FIG. 7 is a partial flow chart illustrating method steps permitting a designer to select a complexity level for a demonstration sequence.

FIG. 7 is a partial flow chart illustrating method steps permitting a designer to select a complexity level for a demonstration sequence. The illustrated method steps are indicated generally by the reference numeral 700 and include a step 702 for selecting a testable part of the design, a step 704 for permitting the designer to select a complexity level for a demonstration sequence, a step 706 in which a demonstration sequence is derived for each identified finite state machine ("FSM"), and a step 708 in which preprogrammed demonstration sequence templates are retrieved from a library for each non-FSM testable part.

In another specific embodiment of the invention, the user is able to select a level of complexity for a demonstration sequence. This feature permits the user to begin demonstrating testable part behavior at a low level and as confidence is gained that the part is functioning correctly, to increase the level of complexity to explore the behavior more completely. In a specific example the user begins testing a finite state machine testable part by insuring that it is able to be initialized to a known state, for example, a reset state. Once having determined that the testable part can be reset, the user can select a more complex mode of operation for the testable part finite state machine. He can select a demonstration sequence that allows him to single step through some of the reachable states of the machine. Finally, the user can select a more complex demonstration sequence that permits him to traverse each edge of a displayed state transition graph connecting reachable states, i.e., included edges.

Figure 8:
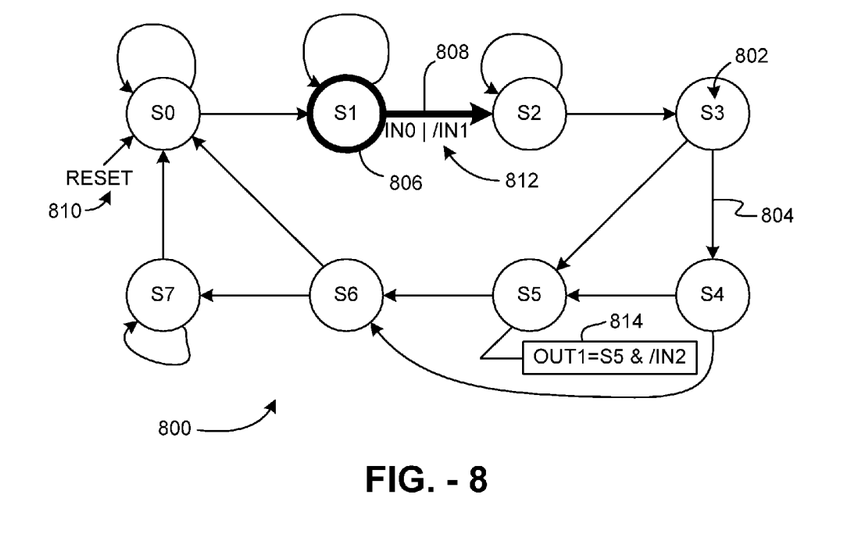
FIG. 8 is a simplified state transition graph according to another aspect of the present invention.

FIG. 8 is a simplified state transition graph according to another aspect of the present invention. The graph is designated generally by the reference numeral 800 and includes a representative state 802 ("S3"), a representative transition 804 (an "included edge"), a highlighted state 806, a highlighted transition 808, a transition condition 810 ("RESET"), a second transition condition 812 ("IN0 I/IN1"), and a Mealy/Moore defined output 814 ("OUT=S5 & /IN2").

In another specific embodiment of the invention the user interface displays an example 800 of a state transition graph for a finite state machine testable part. In this example of a state transition graph every state is reachable from every other state in that a path exists via included edges and states from each state to every other state. The RESET condition 810 initializes the diagram to state S0. State S1 806 and included edge 808 between S1 and state S2 are shown having a wider line width than the remainder of the diagram. The widened lines represent highlighting that is otherwise difficult to represent in a drawing. The transition condition "IN0 I/IN1" 812 represents a condition in which a signal IN0 is asserted OR a signal /IN1 is asserted, or both are asserted. The vertical mark between the two signal names is equivalent to the logical OR. The forward slash mark preceding the signal name IN1 is equivalent to the logical NOT. Thus state S1 is followed by state S2 whenever the transition condition 812 is TRUE (is satisfied). A displayed output 814 is shown within a box extending from state S5. The output defines a signal OUT1 that is asserted during state S5 when the signal /IN2 is asserted. The ampersand symbol located between S5 and /IN2 is equivalent to the logical AND.

In a specific embodiment of the invention, a state transition graph for a testable part identified as a finite state machine is displayed on the user interface. The user is able to single step through the reachable states of the diagram to gain assurance that his HDL code has correctly implemented his understanding of the requirements of the informal design specification. In a specific embodiment, states that have been visited previously and included edges that have been traversed previously are highlighted to distinguish them from states and edges remaining to be visited. In another specific embodiment, a current state is highlighted in a manner that contrasts with the highlighting used for previously visited states (not illustrated) so that in a complex state diagram the user is better able to navigate. In yet another specific embodiment, edge transition conditions are displayed (e.g., see edge condition 812), and in another specific embodiment Mealy/Moore defined outputs are displayed (see output 814).

Figure 9:
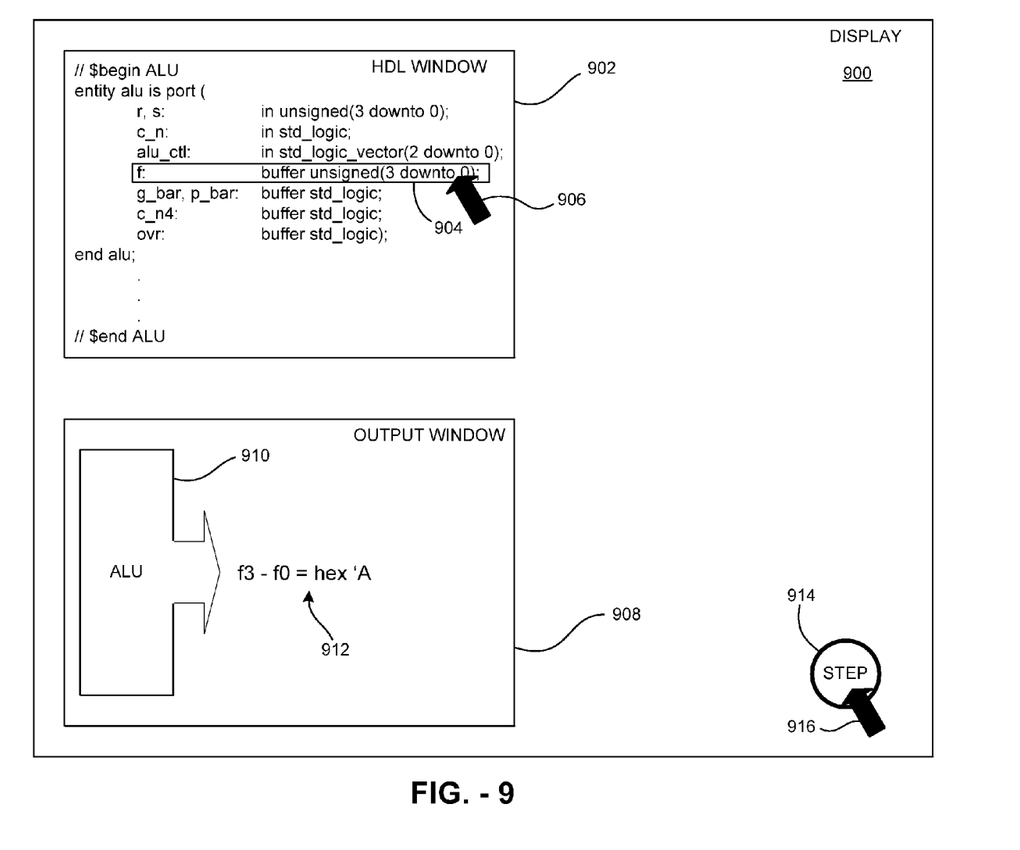
FIG. 9 is a simplified screen view illustrating several user interface features of the present invention.

FIG. 9 is a simplified screen view illustrating several user interface features of the present invention. A user interface display screen is designated generally by the reference numeral 900, and includes an HDL window 902, a selected VHDL-defined bus output 904, a cursor in a first position 906, an output window 908, an ALU 910, an observable output bus 912, a single-step button 914, and a cursor 916 shown in a second position on the display screen.

In a specific embodiment of the user interface the display 900 is a window displayed on the computer display monitor. Within the display window 900 is located a window 902 that displays the HDL code defining an arithmetic and logic unit (ALU) expressed in the VHDL hardware description language. The displayed code includes an entity declaration defining the input and output ports (signals) for the ALU. An output bus of the ALU defines a bus {f3, f2, f1, f0}. The VHDL statement 904 defining that bus has been selected by the user's positioning a cursor 906 over the statement and clicking a selection button (not shown). The box drawn around the statement 904 indicates that the statement has been selected. On an actual display the line would be highlighted in some manner to indicate selection. Also in an actual display the left hand side of the HDL window 902 would include a vertical scroll bar (not shown) permitting all the HDL code of the testable part ALU to be displayed in scroll fashion.

The output window 908 illustrates a simplified ALU 910 having an output bus f3–f0. A current value for the bus signals is displayed coded as a hexadecimal value and indicated generally by the reference numeral 912. As the current value on the output bus changes, the displayed hexadecimal value changes (not shown).

In another specific embodiment of the user interface, a single step button 914 is displayed and is selected by the user's moving the cursor (shown in a second position 916) over the button and clicking on the single step button 914 to advance the displayed behavioral simulation by one time interval.

It will be appreciated that additional display windows (not shown) are part of the user interface. Such windows include display of input signal/bus values for a testable part, and any internal signal/bus values of the testable part. Such display types are well known in the simulation and verification fields and include signal/bus waveforms.

While the invention has been described in relation to the embodiments shown in the accompanying drawing figures, other embodiments, alternatives and modifications will be apparent to those skilled in the art. It is intended that the specification be exemplary only, and that the true scope and spirit of the invention be indicated by the following claims.

What is claimed is:

1. A method for an incremental behavioral validation of a digital design expressed in a hardware description language, comprising the steps of:
    (a) receiving a digital design expressed in a hardware description language;
    (b) providing means for;
        (1) permitting a user to classify testable parts of the design by inserting special comments,
        (2) permitting the user to observe results of a behavioral simulation of a testable part and to decide whether the testable part correctly implements the user's understanding of an informal design specification, and
        (3) permitting the user to modify the design in an attempt to correctly implement his understanding of the informal design specification;
    (c) selecting a classified testable part and creating a demonstration sequence for the testable part;
    (d) performing a behavioral simulation of the selected testable part by driving the simulation with the created demonstration sequence;
    (e) observing the results of the behavioral simulation and deciding whether the testable part correctly implements the user's understanding of the informal design specification;
    (f) if the testable part is a correct implementation, then continuing with step
    (g), else, continuing from step (h);
    (g) determining whether there are more as yet unselected classified testable parts, and if so, selecting a next classified testable part and creating a demonstration sequence for the selected testable part, and continuing from step
    (d), else, terminating the method;
    (h) modifying the design in an attempt to correctly implement the user's understanding of the informal design specification, and creating a demonstration sequence for the selected testable part of the modified design, and continuing from step (d).

2. The method set forth in claim 1 further including a step for providing means for permitting the user to select a level of demonstration sequence complexity.

3. The method set forth in claim 1 wherein the performing behavioral simulation step further includes a step for controlling Inputs of a testable part of the digital design.

4. The method set forth in ciaim 1 wherein the performing behavioral simulation step further includes a step for observing outputs of a testable part of the digital design.

5. The method set forth in claim 1 further includes a step for providing a pointing device for user selection of controllable signals and buses and selection of observable signals and buses.

6. The method set forth in claim 1 wherein the testable part defines a finite state machine and the demonstration sequence drives the behavioral simulation to cause the finite state machine to visit reachable states and to traverse included edges of a state transition graph of the finite state machine.

7. The method set forth in claim 6 further including a step for providing means for displaying the state transition graph.

8. The method set forth in claim 7 further including a step for providing means for permitting the user to single step through the states of the displayed state transition graph.

9. The method set forth in claim 8 further including a step for providing means for highlighting a currently visited state.

10. The method set forth in claim 9 further including a step for providing means for highlighting previously visited states in a manner contrasting with the highlighting of the currently visited state.

11. The method set forth in claim 8 further includes a step for providing means for displaying state transition graph edge transition conditions.

12. The method set forth in claim 8 further includes a step for providing means for displaying Mealy/Moore defined output conditions.

13. The method set forth in claim 8 further includes a step for providing means for highlighting state transition graph edges that have been traversed in contrast to an edge that will be currently traversed.

14. The method set forth in claim 1 further Includes a step for providing a library of demonstration sequence templates.

15. The method set forth in claim 14 wherein the selected testable part defines a non-finite state machine function and the method further includes steps for selecting a demonstration sequence template from the library, modifying the template to accommodate specific parameters of the testable part, and driving the behavioral simulation with the modified template.

16. The method set forth in claim 15 further includes a step for providing means for permitting the user to select a bus for displaying the bus contents as coded vectors.

17. The method set forth in claim 15 further includes a step for providing means for selectively controlling any signal and bus and for selectively observing any signal and bus.

18. The method set forth in claim 15 further includes a step for providing means for permitting the user to single-step through a data-path demonstration sequence simulation.

19. A computer program product for use with a computer system, comprising:
    (a) a computer readable medium; and
    (b) means provided on the medium for directing a computer system to perform a method for an incremental behavioral validation of a digital design expressed in a hardware description language, said method comprising:

(1) receiving a digital design expressed in a hardware description language;

(2) providing means for:

(i) permitting a user to classify testable parts of the design by inserting special comments,     (ii) permitting the user to observe results of a behavioral simulation of a testable part and to decide whether the testable part correctly implements the user's understanding of an informal design specification, and     (iii) permitting the user to modify the design in an attempt to correctly implement his understanding of the informal design specification;

(3) selecting a classified testable part and creating a demonstration sequence for the testable part;

(4) performing a behavioral simulation of the selected testable part and driving the simulation using the created demonstration sequence;

(5) observing the results of the behavioral simulation and deciding whether the testable part correctly implements the user's understanding of the informal design specification;

(6) if the testable part is a correct implementation, then continuing with step (b)(7). else, continuing fmm step (b)(8);

(7) determining whether there are more as yet unexamined testable parts, and if so, selecting a next classified testable part and creating a demonstration sequence for the selected testable part, and continuing from step (b)(4), else, terminating the method;

(8) modifying the design in an attempt to correctly implement the user's understanding of the informal design specification, and creating a demonstration sequence for the selected testable part of the modified design, and continuing from step (b)(4).

20. A system for an incremental behavioral validation of a digital design expressed in a hardware description language, comprising:

(a) means for receiving a digital design expressed in a hardware description language;

(b) a user interface permitting a system user to classify testable parts of the design by inserting special comments into the design;

(c) means for selecting a classified testable part of the design and for creating a demonstration sequence for the selected testable part;

(d) means for performing a behavioral simulation of the selected testable part by driving the simulation with the created demonstration sequence;

(e) the user interface including display means for permitting the system user to observe results of the behavioral simulation and to determine whether the testable part correctly implements the users understanding of an informal design specification;

(f) the user interface permitting the system user to modify the design of the testable part in an attempt to correctly implement the user's understanding of the informal design specification;

(g) means for creating a demonstration sequence for the modified testable part;

(h) means for performing a behavioral simulation of the modified testable part by driving the simulation with the created demonstration sequence for the modified testable part;

(i) means for continuing the observing, modifying, and simulation of the testable part until the user is satisfied that the part correctly implements the user's understanding of the informal design specification; and     (j) means for continuing with a next testable part until the user is satisfied that the digital design implements the user's understanding of the informal design specification.

* * * * *